US010717870B1

(12) United States Patent
Gubbels et al.

(10) Patent No.: US 10,717,870 B1
(45) Date of Patent: Jul. 21, 2020

(54) ELASTOMERIC COMPOSITIONS AND THEIR APPLICATIONS

(71) Applicant: DOW SILICONES CORPORATION, Midland, MI (US)

(72) Inventors: Frederic Gubbels, Seneffe (BE); Thierry Cooremans, Seneffe (BE); Julien Renaud, Seneffe (BE); Francois De Buyl, Seneffe (BE); Martijn Beukema, Seneffe (BE); Victor Baily, Seneffe (BE); Gregory Chambard, Seneffe (BE)

(73) Assignee: DOW SILICONES CORPORATION, Midland, MI (US)

(*) Notice: Subject to any disclaimer, the term of this patent is extended or adjusted under 35 U.S.C. 154(b) by 0 days.

(21) Appl. No.: 16/635,924

(22) PCT Filed: Jul. 17, 2018

(86) PCT No.: PCT/US2018/042405
§ 371 (c)(1),
(2) Date: Jan. 31, 2020

(87) PCT Pub. No.: WO2019/027668
PCT Pub. Date: Feb. 7, 2019

(30) Foreign Application Priority Data

Aug. 3, 2017 (GB) ................................... 1712519.6

(51) Int. Cl.
*C08G 77/08* (2006.01)
*C08L 83/04* (2006.01)
*C08G 77/14* (2006.01)
*H01L 33/56* (2010.01)
*B01J 21/06* (2006.01)
*C08K 3/013* (2018.01)
*H01L 23/29* (2006.01)

(52) U.S. Cl.
CPC .............. *C08L 83/04* (2013.01); *C08G 77/14* (2013.01); *B01J 21/063* (2013.01); *B01J 21/066* (2013.01); *C08K 3/013* (2018.01); *H01L 23/296* (2013.01); *H01L 33/56* (2013.01)

(58) Field of Classification Search
CPC . C07F 7/18; C08L 83/06; C08G 77/18; C08G 77/16; C08G 77/24; C09D 183/06
See application file for complete search history.

(56) References Cited

U.S. PATENT DOCUMENTS

| 4,087,585 A | 5/1978 | Schulz |
| 5,194,649 A | 3/1993 | Okawa |
| 6,284,385 B1 * | 9/2001 | Guillaumon ........... B64G 1/503 428/450 |

FOREIGN PATENT DOCUMENTS

| WO | 2016120270 A1 | 8/2016 |
| WO | 2017131322 A1 | 8/2017 |

OTHER PUBLICATIONS

International Search Report and Written Opinion for PCT/US2018/042405 dated Sep. 24, 2018, 10 pages.
Noll, W.; Chemistry and Technology of Silicones, Academic Press Inc., New York, 1968, pp. 397, 399.
Michael A. Brook; Silicon in Organic, Organometallic and Polymer Chemistry, John Wiley & sons, Inc. (2000), p. 285.

* cited by examiner

*Primary Examiner* — Kuo Liang Peng
(74) *Attorney, Agent, or Firm* — Warner Norcross + Judd LLP

(57) ABSTRACT

A room temperature curable composition is disclosed. The composition can be used as an encapsulation/potting material. The composition comprises: (i) at least one condensation curable silyl terminated polymer having at least one silicon bonded hydroxyl functional group per molecule; (ii) a cross-linker having at least two hydrolysable groups and selected from certain silanes and/or silyl functional molecules; and (iii) a condensation catalyst selected from the group of titanates and/or zirconates. The molar ratio of the sum of moisture present in the composition and total silicon bonded hydroxyl groups:the catalyst ("the molar ratio") is >7:1. When the molar ratio is from >7:1 to 10:1, the molar ratio of total silicon bonded hydroxyl groups:total hydrolysable groups is between 0.1:1 to 0.3:1. When the molar ratio is >10:1, the molar ratio of total silicon bonded hydroxyl groups:total hydrolysable groups is between 0.1:1 to 0.5:1.

18 Claims, No Drawings

ELASTOMERIC COMPOSITIONS AND THEIR APPLICATIONS

CROSS-REFERENCE TO RELATED APPLICATIONS

This application is the National Stage of International Appl. No. PCT/US2018/042405 filed on 17 Jul. 2018, which claims priority to and all advantages of Great Britain Application No. 1712519.6 filed on 3 Aug. 2017, the content of which is hereby incorporated by reference.

TECHNICAL FIELD

The present disclosure generally relates to silicone encapsulants, e.g., materials cured via a condensation cure chemistry and their applications, especially as encapsulants and/or pottants for electronic and/or optical assemblies, e.g., LED lighting assemblies.

BACKGROUND

In many instances materials used as-coating, potting, and encapsulating materials e.g., gels must maintain adhesion to substrates. In electronics for example, gels are a special class of encapsulants that cure to form an extremely soft material. They are used to provide high levels of stress relief to sensitive circuitry. These materials may be used to perform many important functions in electronics. Their major function is to protect electronic assemblies and components from adverse environments by providing dielectric insulation, prevention of contaminant (e.g., moisture) ingress into/onto electronic circuitry and protection of electronic components from mechanical and thermal stress on components. In such situations the encapsulants are required to adhere to electronic and electrical components and printed circuit boards in addition to the electrical connectors and conductors that pass through the coating or encapsulating material.

Whilst a variety of organic based and silicone based encapsulants are available commercially, they each have disadvantages. For example:
(i) many commercially available silicone adhesives/encapsulants/pottants are not optically clear;
(ii) Epoxy based materials, polyurethane and silicones are known to discolour (e.g., yellow) with age;
(iii) Silicone based room temperature addition (hydrosilylation) cure materials do not provide sufficient adhesion to substrate surfaces;
(iv) In view of (iii) above, many silicone addition cure materials with adhesion promoters to enhance adhesion are required to cure at temperatures >100° C. (e.g., from 120-150° C.) which many electronic boards and the like cannot support; and
(v) Polyurethane or epoxy based materials are known to have high levels of shrinkage during cure which can create problems when used in large scale commercial situations.

The commercial silicone materials that are currently used to form the encapsulants and pottants etc. (e.g., gels) are expensive being based on addition cure chemistry, i.e., they are cured by the hydrosilylation/addition reaction of a silicon hydride group with an unsaturated carbon radical with the help of a catalyst, which is typically a platinum based compound. Historically the industry has preferred addition cure compositions of this type for these applications because they immediately cure throughout the body of the compound resulting in a cured material in a matter of minutes whilst condensation cure systems are significantly slower, titanate cured condensation processes can take e.g., up to 7 days curing per 6 mm of depth of the body of the uncured material. Tin cured condensation systems do cure over a shorter period but they are not desired for e.g., electronics applications because they undergo reversion (i.e., depolymerisation) at temperatures above 80° C.

Whilst from a cure speed standpoint materials made from hydrosilylation cure compositions are excellent there are several potential problems and/or disadvantages with their use. For example, they are generally cured at elevated temperature (i.e., in excess of 100° C.) and can be contaminated and rendered uncurable due to inactivation of expensive platinum based cure catalysts which are sensitive and may be poisoned by amine containing compounds, sulphur containing compounds and phosphorus containing compounds.

It is well known to people skilled in the art that alkoxy titanium compounds—i.e., alkyl titanates—are suitable catalysts for formulating one component moisture curable silicones (References: Noll, W.; Chemistry and Technology of Silicones, Academic Press Inc., New York, 1968, p. 399, Michael A. Brook, silicon in organic, organometallic and polymer chemistry, John Wiley & sons, Inc. (2000), p. 285). Titanate catalysts have been widely described for their use to formulate skin or diffusion cured one-part condensation curing silicone elastomers. These formulations are typically available in one-part packages that are applied in a layer that is thinner than typically 15 mm. Layers thicker than 15 mm are known to lead to uncured material in the depth of the material, because the moisture is very slow to diffuse in very deep sections. Skin or diffusion cure (e.g., moisture/condensation) takes place when the initial cure process takes place by the formation of a cured skin at the composition/air interface subsequent to the sealant/encapsulant being applied on to a substrate surface. Subsequent to the generation of the surface skin the cure speed is dependent on the speed of diffusion of moisture from the sealant/encapsulant interface with air to the inside (or core), and the diffusion of condensation reaction by-product/effluent from the inside (or core) to the outside (or surface) of the material and the gradual thickening of the cured skin over time from the outside/surface to the inside/core.

Multi component compositions designed to activate condensation cure in the bulk of the product do not use titanium based catalysts. They generally use other metal catalysts such as tin or zinc catalyst, e.g., dibutyl tin dilaurate, tin octoate and/or zinc octoate (Noll, W.; Chemistry and Technology of Silicones, Academic Press Inc., New York, 1968, p. 397). In silicone compositions stored before use in two or more parts, one-part contains a filler which typically contains the moisture required to activate condensation cure in the bulk of the product. Unlike the previously mentioned diffusion cure one-part system, two-part condensation cure systems, once mixed together, enable bulk cure even in sections greater than 15 mm in depth. In this case the composition will cure (subsequent to mixing) throughout the material bulk. If a skin is formed, it will be only in the first minutes after application. Soon after, the product will become a solid in the entire mass. Titanate catalysts are not used for curing these types of two part compositions because it is well known that in the presence of a significant amount of moisture alkyl titanate catalysts will fully hydrolyse to form tetrahydroxy titanate, which is insoluble in silicone. This form of titanium loses its catalytic efficiency, leading to uncured systems. Hence, there is a need for an optically clear, room temperature curable, LED lighting encapsulation/potting material.

BRIEF SUMMARY OF THE INVENTION

There is provided a room temperature curable encapsulation/potting material composition comprising:
(i) at least one condensation curable silyl terminated polymer having at least one, typically at least 2 Si-hydroxyl functional groups per molecule;
(ii) a cross-linker selected from the group of
  silanes having at least 2 hydrolysable groups, alternatively at least 3 hydrolysable groups per molecule group; and/or
  silyl functional molecules having at least 2 silyl groups, each silyl group containing at least one hydrolysable group.
(iii) a condensation catalyst selected from the group of titanates and zirconates characterized in that:
  the molar ratio of the sum of moisture present in the formulation, as determined in accordance with ISO 787-2:1981 and total silicon bonded hydroxyl groups:the catalyst is >7:1; and
  (a) when the molar ratio of the sum of moisture present in the formulation, as determined in accordance with ISO 787-2:1981 and total silicon bonded hydroxyl groups:the catalyst is from >7:1 to 10:1 the molar ratio of total silicon bonded hydroxyl groups:total hydrolysable groups is between 0.1:1 to 0.3:1 and
  (b) when the molar ratio of the sum of moisture present in the formulation, as determined in accordance with ISO 787-2:1981 and total silicon bonded hydroxyl groups:the catalyst is from >10:1 the molar ratio of total silicon bonded hydroxyl groups:total hydrolysable groups is between 0.1:1 to 0.5:1.

In one alternative condensation catalyst (iii) is selected from the group of titanates and zirconates characterized in that:
  the molar ratio of total silicon bonded hydroxyl groups: total hydrolysable groups is between 0.1:1 to 0.5:1 and the molar ratio of the sum of moisture present in the formulation as determined in accordance with ISO 787-2:1981 and total silicon bonded hydroxyl: the catalyst is >10:1.

A silicone material which is the condensation reaction product of the above, i.e., the condensation reaction product of the following composition:
(i) at least one condensation curable silyl terminated polymer having at least one, typically at least 2 Si-hydroxyl functional groups per molecule;
(ii) a cross-linker selected from the group of
  silanes having at least 2 hydrolysable groups, alternatively at least 3 hydrolysable groups per molecule group; and/or
  silyl functional molecules having at least 2 silyl groups, each silyl group containing at least one hydrolysable group.
(iii) a condensation catalyst selected from the group of titanates and zirconates characterized in that:
  the molar ratio of the sum of moisture present in the formulation, as determined in accordance with ISO 787-2:1981 and total silicon bonded hydroxyl groups:the catalyst is >7:1; and
  (a) when the molar ratio of the sum of moisture present in the formulation, as determined in accordance with ISO 787-2:1981 and total silicon bonded hydroxyl groups:the catalyst is from >7:1 to 10:1 the molar ratio of total silicon bonded hydroxyl groups:total hydrolysable groups is between 0.1:1 to 0.3:1 and
  (b) when the molar ratio of the sum of moisture present in the formulation, as determined in accordance with ISO 787-2:1981 and total silicon bonded hydroxyl groups:the catalyst is from >10:1 the molar ratio of total silicon bonded hydroxyl groups:total hydrolysable groups is between 0.1:1 to 0.5:1.

DETAILED DESCRIPTION

It is to be understood that for the sake of this application that "total hydrolysable groups" excludes both moisture and silicon bonded hydroxyl groups present in the composition. For the avoidance of doubt moisture as hereinbefore described means water. The moisture contained within the composition is typically retained by filler when present therein. The amount of moisture present in the filler is determined as previously discussed in accordance with ISO 787-2:1981 which is explained in greater detail hereafter.

The total silicon bonded hydroxyl (Si—OH) molar content is calculated for 100 g of the mixed formulation. The silicon bonded hydroxyl molar content related to a polymer is equal to the amount in grams (g) of hydroxyl containing polymer in 100 g of the mixed product (i.e., total composition) divided by the number average molecular weight of the polymer multiplied by the average number of hydroxyl functions present in the polymer, typically 2. If there are several hydroxyl functional polymers in the formulation, the sum of the molar content of each polymer determined and then the cumulative total from all the polymers is added together to constitute the total silanol molar content in the formulation.

The total molar content of hydrolysable groups is determined in an analogous fashion using the hydrolysable groups as opposed to the hydroxyl functions.

The molar content of hydrolysable groups is equal to the amount in g of the molecules that contain hydrolysable groups in 100 g of the mixed product (i.e., total composition) divided by the actual molecular weight of the molecule or the number average molecular weight in case it is a polymeric molecule multiplied by the average number of hydrolysable functions present in the molecule.

The molar ratio of total silicon bonded hydroxyl groups to total hydrolysable groups is then calculated by dividing the total molar content of silicon bonded hydroxyl (Si—OH) by the total molar content of hydrolysable groups or can be provided as a ratio.

When present, the source of moisture present in the composition is considered to be the moisture (water) contained in the filler. The quantitative amount of moisture present in the filler is determined by the extraction of moisture (water) from samples of the filler used in our compositions using the test method of ISO787 2:1981 which is summarised below for the avoidance of doubt:
1) Put an empty glass container of 100 ml in an oven at 1050 to dry for 2 hours.
2) Put the resulting dried glass container in a desiccator until it reaches room temperature.
3) Weigh the glass container accurately (W1);
4) Add around 1 g of filler(s) into the container and weigh accurately (W2).
5) Place the glass container holding the filler(s) in an oven at 1050 for 2 hours.
6) Put the glass container holding the filler(s) in a desiccator until it reaches room temperature;

7) Weigh the glass container holding the filler(s) accurately (W3).

The moisture content is calculated by the following formula:

Moisture content (%)=100×(W2−W3)/(W2−W1)

For the avoidance of doubt, it should be understood that:
the number of moles of moisture is =the number of moles of water, and
the number of mole of moisture per 100 g of starting filler material=100×(W2−W3)/[(W2−W1)×18], from which the amount of moisture/water present in filler added into the composition may be determined based on the weight of filler used in the composition.

The molar amount of catalyst was determined using the following calculation:
[Weight in Parts of Catalyst×the Relative Amount of Catalyst Part (i.e., =1)]

[relative amount of catalyst part+relative amount of base]×MW of catalyst

Hence, merely for example when the catalyst is tetra n-butyl titanate (TnBT) if the composition were stored in 2 parts before mixing and the weight ratio of the two parts when mixed is 10:1, i.e., 10 parts of base to every one part by weight of catalyst composition, given the molecular weight of TnBT is 340; the calculation would be.
[Weight in Parts of TnBT in Catalyst Part×the Relative Amount of Catalyst Part (i.e., =1)]

[relative amount of catalyst part (1)+relative amount of base (10)]×340

The number average molecular weight (Mn) and weight average molecular weight (Mw) of silicone may be determined by Gel permeation chromatography (GPC). This technique is a standard technique, and yields values for Mw (weight average), Mn (number average) and polydispersity index (PI) (where PI=Mw/Mn).

Mn values provided in this application have been determined by GPC and represent a typical value of the polymer used. If not provided by GPC, the Mn may also be obtained from calculation based on the dynamic viscosity of said polymer.

The main advantages of these compositions are that they cure at room temperature and adhere to substrates at room temperature. They are also more resistant to contaminants than addition cured silicones which use platinum based catalysts. They are optically clear, especially in the absence of filler, and do not undergo reversion.

Polymer (i) is at least one moisture/condensation curable silyl terminated polymer. Any suitable moisture/condensation curable silyl terminated polymer may be utilised including polydialkyl siloxanes, alkylphenylsiloxane, or organic based polymers with silyl terminal groups e.g., silyl terminated polyethers, silyl terminated acrylates and silyl terminated polyisobutylenes or copolymers of any of the above. Preferably the polymer is a polysiloxane based polymer containing at least two silicon bonded hydroxyl groups, most preferably the polymer comprises terminal silicon bonded hydroxyl groups. Examples of suitable groups containing Si bonded hydroxyl groups include —Si(OH)$_3$, —(R$^a$)Si(OH)$_2$, —(R$^a$)$_2$Si(OH), and —(R$^a$)$_2$Si—R$^c$—SiR$^d_p$(OH)$_{3-p}$ where each R$^a$ independently represents a monovalent hydrocarbyl group, for example, an alkyl group, in particular having from 1 to 8 carbon atoms, (and is preferably methyl); each R$^d$ group is independently an alkyl group having up to 6 carbon atoms; R$^c$ is a divalent hydrocarbon group which may be interrupted by one or more siloxane spacers having up to six silicon atoms; and p has the value 0, 1 or 2.

Preferably polymer (i) has the general formula $$X^3\text{-}A\text{-}X^1 \tag{1}$$

where $X^3$ and $X^1$ are independently selected from siloxane groups which terminate in hydroxyl or hydrolysable groups and A is a siloxane containing polymeric chain.

Examples of silicon bonded hydroxyl containing terminating groups $X^3$ or $X^1$ include —Si(OH)$_3$, —(R$^a$)Si(OH)$_2$, —(R$^a$)$_2$Si(OH), and —(R$^a$)$_2$Si—R$^c$—SiR$^d_p$(OH)$_{3-p}$ as defined above with each R$^d$ group, when present, typically being a methyl group. Preferably the $X^3$ and/or $X^1$ terminal groups are hydroxydialkyl silyl groups, e.g., hydroxydimethyl silyl groups or alkoxydialkyl silyl groups e.g., methoxydimethyl silyl or ethoxydimethyl silyl. Most preferably the $X^3$ and/or $X^1$ terminal groups are hydroxydimethyl silyl groups.

Examples of suitable siloxane groups in polymeric chain A of formula (I) are those which comprise a polydiorganosiloxane chain. Thus polymeric chain A preferably includes siloxane units of formula (2)

$$-(R^5_s SiO_{(4-s)/2})- \tag{2}$$

in which each $R^5$ is independently an organic group such as a hydrocarbyl group having from 1 to 10 carbon atoms optionally substituted with one or more halogen group such as chlorine or fluorine and s is 0, 1 or 2. Particular examples of groups $R^5$ include methyl, ethyl, propyl, butyl, vinyl, cyclohexyl, phenyl, tolyl group, a propyl group substituted with chlorine or fluorine such as 3,3,3-trifluoropropyl, chlorophenyl, beta-(perfluorobutyl)ethyl or chlorocyclohexyl group. Suitably, at least some and preferably substantially all of the groups $R^5$ are methyl.

Typically the polymers of the above type will have a viscosity in the order of 400 to 300 000 mPa·s, alternatively 1000 to 100 000 mPa·s at 23° C. measured by using a Brookfield cone plate viscometer (RV DIII) using the most suitable cone plate.

Preferred polysiloxanes containing units of formula (2) are thus polydiorganosiloxanes having terminal, silicon-bound hydroxyl groups or terminal, silicon-bound organic radicals, which can be hydrolysed using moisture as defined above. The polydiorganosiloxanes may be homopolymers or copolymers. Mixtures of different polydiorganosiloxanes having terminal condensable groups are also suitable.

In accordance with the present invention polymeric chain A may alternatively be organic based polymers with silyl terminal groups e.g., silyl terminated polyethers, silyl terminated acrylates and silyl terminated polyisobutylenes. In the case of silyl polyethers the polymer chain is based on polyoxyalkylene based units. Such polyoxyalkylene units preferably comprise a linear predominantly oxyalkylene polymer comprised of recurring oxyalkylene units, (—C$_n$H$_{2n}$—O—) illustrated by the average formula (—C$_n$H$_2$—O—)$_y$ wherein n is an integer from 2 to 4 inclusive and y is an integer of at least four. The number average molecular weight of each polyoxyalkylene polymer block may range from about 300 to about 10,000 g/mol, but can be higher in molecular weight. Moreover, the oxyalkylene units are not necessarily identical throughout the polyoxyalkylene monomer, but can differ from unit to unit. A polyoxyalkylene block, for example, can be comprised of oxyethylene units, (—C$_2$H$_4$—O—); oxypropylene units (—C$_3$H$_6$—O—); or oxybutylene units, (—C$_4$H$_8$—O—); or mixtures thereof.

Other polyoxyalkylene units may include for example: units of the structure

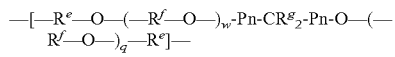

in which Pn is a 1,4-phenylene group, each $R^e$ is the same or different and is a divalent hydrocarbon group having 2 to 8 carbon atoms, each $R^f$ is the same or different and, is, an ethylene group or propylene group, each $R^g$ is the same or different and is, a hydrogen atom or methyl group and each of the subscripts w and q is a positive integer in the range from 3 to 30.

For the purpose of this application "Substituted" means one or more hydrogen atoms in a hydrocarbon group has been replaced with another substituent. Examples of such substituents include, but are not limited to, halogen atoms such as chlorine, fluorine, bromine, and iodine; halogen atom containing groups such as chloromethyl, perfluorobutyl, trifluoroethyl, and nonafluorohexyl; oxygen atoms; oxygen atom containing groups such as (meth)acrylic and carboxyl; nitrogen atoms; nitrogen atom containing groups such as amino-functional groups, amido-functional groups, and cyano-functional groups; sulphur atoms; and sulphur atom containing groups such as mercapto groups.

The backbone of the organic polymer (A) which may contain organic leaving groups within the molecule is not particularly limited and may be any of organic polymers having various backbones.

Crosslinkers (ii) that can be used are generally moisture curing
silanes having at least 2 hydrolysable groups, alternatively at least 3 hydrolysable groups per molecule group; and/or
silyl functional molecules having at least 2 silyl groups, each silyl group containing at least one hydrolysable group.

Typically, a cross-linker requires a minimum of 2 hydrolysable groups per molecule and preferably 3 or more. In some instances, the crosslinker (ii) having two hydrolysable groups may be considered a chain extender, i.e., when polymer (i) only has 1 or two reactive groups, but can be used to cross-link if polymer (i) has 3 or more reactive groups per molecule. The crosslinker (ii) may thus have two but alternatively has three or four silicon-bonded condensable (preferably hydroxyl and/or hydrolysable) groups per molecule which are reactive with the condensable groups in polymer (i).

For the sake of the disclosure herein silyl functional molecule is a silyl functional molecule containing two or more silyl groups, each silyl group containing at least one hydrolysable group. Hence, a disilyl functional molecule comprises two silicon atoms each having at least one hydrolysable group, where the silicon atoms are separated by an organic or siloxane spacer. Typically, the silyl groups on the disilyl functional molecule may be terminal groups. The spacer may be a polymeric chain.

The hydrolysable groups on the silyl groups include acyloxy groups (for example, acetoxy, octanoyloxy, and benzoyloxy groups); ketoximino groups (for example dimethyl ketoximo, and isobutylketoximino); alkoxy groups (for example methoxy, ethoxy, and propoxy) and alkenyloxy groups (for example isopropenyloxy and 1-ethyl-2-methylvinyloxy). In some instances, the hydrolysable group may include hydroxyl groups.

The silane cross-linker (ii) may include alkoxy functional silanes, oximosilanes, acetoxy silanes, acetonoxime silanes and/or enoxy silanes.

When the crosslinker is a silane and when the silane has only three silicon-bonded hydrolysable groups per molecule, the fourth group is suitably a non-hydrolysable silicon-bonded organic group. These silicon-bonded organic groups are suitably hydrocarbyl groups which are optionally substituted by halogen such as fluorine and chlorine. Examples of such fourth groups include alkyl groups (for example methyl, ethyl, propyl, and butyl); cycloalkyl groups (for example cyclopentyl and cyclohexyl); alkenyl groups (for example vinyl and allyl); aryl groups (for example phenyl, and tolyl); aralkyl groups (for example 2-phenylethyl) and groups obtained by replacing all or part of the hydrogen in the preceding organic groups with halogen. The fourth silicon-bonded organic groups may be methyl.

A typical silane may be described by formula (3)

wherein $R^5$ is described above and r has a value of 2, 3 or 4. Typical silanes are those wherein R" represents methyl, ethyl or vinyl or isobutyl. R" is an organic radical selected from linear and branched alkyls, allyls, phenyl and substituted phenyls, acetoxy, oxime. In some instances, $R^5$ represents methyl or ethyl and r is 3.

Another type of suitable crosslinkers (ii) are molecules of the type $Si(OR^5)_4$ where $R^5$ is as described above, alternatively propyl, ethyl or methyl. Partials condensates of $Si(OR^5)_4$ may also be considered.

In one embodiment the cross-linker (ii) is a silyl functional molecule having at least 2 silyl groups each having at least 1 and up to 3 hydrolysable groups, alternatively each silyl group has at least 2 hydrolysable groups.

The crosslinker (ii) may be a disilyl functional polymer, that is, a polymer containing two silyl groups, each containing at least one hydrolysable group such as described by the formula (4)

where $R^4$ is a $C_{1-10}$ alkyl group, $Y^1$ is an alkyl groups containing from 1 to 8 carbons, Q is a chemical group containing a heteroatom with a lone pair of electrons e.g., an amine, N-alkylamine or urea; each x is an integer of from 1 to 6, t is 0 or 1; each m is independently 1, 2 or 3 and n is 0 or 1.

The silyl (e.g., disilyl) functional crosslinker (ii) may have a siloxane or organic polymeric backbone. Suitable polymeric crosslinkers (ii) may have a similar polymeric backbone chemical structure to polymeric chain A as depicted in formula (1) above. In the case of such siloxane or organic based cross-linkers the molecular structure can be straight chained, branched, cyclic or macromolecular, i.e., a silicone or organic polymer chain bearing alkoxy functional end groups include polydimethylsiloxanes having at least one trialkoxy terminal where the alkoxy group may be a methoxy or ethoxy group.

In the case of siloxane based polymers the viscosity of the cross-linker will be within the range of from 0.5 mPa·s to 80,000 mPa·s at 23° C. using a Brookfield cone plate viscometer (RV DIII) utilising a cone plate (measured in the same manner as polymer (i)). Whilst any of the hydrolysable groups mentioned above are suitable it is preferred that the hydrolysable groups are alkoxy groups and as such the terminal silyl groups may have the formula such as —$R^a$Si$(OR^b)_2$, —Si$(OR^b)_3$, —$R^a_2$SiOR$^b$ or —$(R^a)_2$Si—$R^c$—SiR$^d_p$$(OR^b)_{3-p}$ where each $R^a$ independently represents a monovalent hydrocarbyl group, for example, an alkyl group, in particular having from 1 to 8 carbon atoms, (and is preferably methyl); each $R^b$ and $R^d$ group is independently an alkyl group having up to 6 carbon atoms; $R^c$ is a divalent hydrocarbon group which may be interrupted by one or more siloxane spacers having up to six silicon atoms; and p has the value 0, 1 or 2. Typically each terminal silyl group will have 2 or 3 alkoxy groups.

Crosslinkers (ii) thus include alkyltrialkoxysilanes such as methyltrimethoxysilane (MTM) and methyltriethoxysilane, tetraethoxysilane, partially condensed tetraethoxysilane, alkenyltrialkoxy silanes such as vinyltrimethoxysilane and vinyltriethoxysilane, isobutyltrimethoxysilane (iBTM). Other suitable silanes include ethyltrimethoxysilane, vinyltriethoxysilane, phenyltrimethoxysilane, alkoxytrioximosilane, alkenyltrioximosilane, 3,3,3-trifluoropropyltrimethoxysilane, methyltriacetoxysilane, vinyltriacetoxysilane, ethyl triacetoxysilane, di-butoxy diacetoxysilane, phenyl-tripropionoxysilane, methyltris(methylethylketoximo)silane, vinyltris-methylethylketoximo)silane, methyltris(methylethyloximino)silane, methyltris(isopropenoxy)silane, vinyltris (isopropenoxy)silane, ethylpolysilicate, n-propylorthosilicate, ethylorthosilicate, dimethyltetraacetoxydisiloxane, oximosilanes, acetoxy silanes, acetonoxime silanes, enoxy silanes and other such trifunctional alkoxysilanes as well as partial hydrolytic condensation products thereof; 1,6-bis (trimethoxysilyl)hexane (alternatively known as hexamethoxydisilylhexane), bis (trialkoxysilylalkyl)amines, bis (dialkoxyalkylsilylalkyl)amine, bis (trialkoxysilylalkyl)N-alkylamine, bis (dialkoxyalkylsilylalkyl)N-alkylamine, bis (trialkoxysilylalkyl)urea, bis (dialkoxyalkylsilylalkyl) urea, bis (3-trimethoxysilylpropyl) amine, bis (3-triethoxysilylpropyl)amine, bis (4-trimethoxysilylbutyl)amine, bis (4-triethoxysilylbutyl) amine, bis (3-trimethoxysilylpropyl)N-methylamine, bis (3-triethoxysilylpropyl)N-methylamine, bis (4-trimethoxysilylbutyl)N-methylamine, bis (4-triethoxysilylbutyl)N-methylamine, bis (3-trimethoxysilylpropyl)urea, bis (3-triethoxysilylpropyl)urea, bis (4-trimethoxysilylbutyl)urea, bis (4-triethoxysilylbutyl)urea, bis (3-dimethoxymethylsilylpropyl)amine, bis (3-diethoxymethyl silylpropyl)amine, bis (4-dimethoxymethylsilylbutyl)amine, bis (4-diethoxymethyl silylbutyl)amine, bis (3-dimethoxymethylsilylpropyl) N-methylamine, bis (3-diethoxymethyl silylpropyl)N-methylamine, bis (4-dimethoxymethylsilylbutyl)N-methylamine, bis (4-diethoxymethyl silylbutyl)N-methylamine, bis (3-dimethoxymethylsilylpropyl)urea, bis (3-diethoxymethyl silylpropyl)urea, bis (4-dimethoxymethylsilylbutyl)urea, bis (4-diethoxymethyl silylbutyl)urea, bis (3-dimethoxyethylsilylpropyl)amine, bis (3-diethoxyethyl silylpropyl)amine, bis (4-dimethoxyethylsilylbutyl)amine, bis (4-diethoxyethyl silylbutyl)amine, bis (3-dimethoxyethylsilylpropyl)N-methylamine, bis (3-diethoxyethyl silylpropyl)N-methylamine, bis (4-dimethoxyethylsilylbutyl)N-methylamine, bis (4-diethoxyethyl silylbutyl)N-methylamine, bis (3-dimethoxyethylsilylpropyl)urea bis (3-diethoxyethyl silylpropyl)urea, bis (4-dimethoxyethylsilylbutyl)urea and/or bis (4-diethoxyethyl silylbutyl)urea; bis (triethoxysilylpropyl)amine, bis (trimethoxysilylpropyl)amine, bis (trimethoxysilylpropyl)urea, bis (triethoxysilylpropyl)urea, bis (diethoxymethylsilylpropyl)N-methylamine; di or trialkoxy silyl terminated polydialkyl siloxane, di or trialkoxy silyl terminated polyarylalkyl siloxanes, di or trialkoxy silyl terminated polypropyleneoxide, polyurethane, polyacrylates; polyisobutylenes; di or triacetoxy silyl terminated polydialkyl; polyarylalkyl siloxane; di or trioximino silyl terminated polydialkyl; polyarylalkyl siloxane; di or triacetonoxy terminated polydialkyl or polyarylalkyl. The cross-linker (ii) used may also comprise any combination of two or more of the above.

The composition further comprises a condensation catalyst. The catalyst chosen for inclusion in a particular silicone sealant composition depends upon the speed of cure required. Titanate and/or zirconate based catalysts may comprise a compound according to the general formula $Ti[OR^{22}]_4$ where each $R^{22}$ may be the same or different and represents a monovalent, primary, secondary or tertiary aliphatic hydrocarbon group which may be linear or branched containing from 1 to 10 carbon atoms. Optionally the titanate may contain partially unsaturated groups. However, preferred examples of $R^{22}$ include but are not restricted to methyl, ethyl, propyl, isopropyl, butyl, tertiary butyl and a branched secondary alkyl group such as 2, 4-dimethyl-3-pentyl. Preferably, when each $R^{22}$ is the same, $R^{22}$ is an isopropyl, branched secondary alkyl group or a tertiary alkyl group, in particular, tertiary butyl. Suitable examples include for the sake of example, tetra n-butyl titanate, tetra t-butyl titanate, tetra t-butoxy titanate, tetraisopropoxy titanate and diisopropoxydiethylacetoacetate titanate. Alternatively, the titanate may be chelated. The chelation may be with any suitable chelating agent such as an alkyl acetylacetonate such as methyl or ethylacetylacetonate. Alternatively, the titanate may be monoalkoxy titanates bearing three chelating agents such as for example 2-propanolato, tris isooctadecanoato titanate.

The molar ratio of the sum of moisture present in the formulation as determined in accordance with ISO 787-2: 1981 and total silicon bonded hydroxyl to the catalyst is >7:1, alternatively >10:1. As will be discussed below preferably little or no filler will be present in these compositions. Furthermore, when filler is present it may be anhydrous and as such the amount of moisture present as determined in accordance with ISO 787-2:1981 will be low or indeed no moisture may be present in which case it is effectively the molar ratio of total silicon bonded hydroxyl to the catalyst which is >7:1, alternatively >10:1.

However, surprisingly it was found that (a) when the molar ratio of the sum of moisture present in the formulation, as determined in accordance with ISO 787-2:1981 and total silicon bonded hydroxyl groups:the catalyst is from >7:1 to 10:1, the molar ratio of total silicon bonded hydroxyl groups:total hydrolysable groups is between 0.1:1 to 0.3:1 but (b) when the molar ratio of the sum of moisture present in the formulation, as determined in accordance with ISO 787-2:1981 and total silicon bonded hydroxyl groups: the catalyst is from >10:1, the molar ratio of total silicon bonded hydroxyl groups:total hydrolysable groups is between 0.1:1 to 0.5:1.

The material (e.g., gel) as hereinbefore described is typically made from the condensation curable material composition which is stored in a 2 part manner. The two part compositions may be mixed using any appropriate standard two-part mixing equipment with a dynamic or static mixer and is optionally dispensed therefrom for use in the application for which it is intended. In one embodiment condensation curable material composition is stored in two parts having polymer (i) and cross-linker (ii) in one part (base part) and polymer (i) and catalyst (iii) in the other part. In an alternative embodiment the condensation curable material composition is stored in two parts having polymer (i) in one part (base part) and cross-linker (ii) and catalyst (iii) in the other part. In a still further embodiment the condensation curable material composition is stored in two parts having a first polymer (i) and cross-linker (ii) in one part and a second polymer (i) and catalyst (iii) in the other part. The two parts can be mixed in any suitable ratio, e.g., base part:catalyst package from 10:1 to 1:1, alternatively 5:1 to 1:1, preferably 1:1. Usually went present filler will go in the base part.

Fillers

Typically in the present invention the composition used does not contain a filler of any sort as one of the attributes of the material herein is its high light transmittance (>90%), which will be affected by the presence of a filler. In particular the composition does preferably not contain fillers or compounds that brings a significant amount of moisture in the composition. The total moisture content brought about by the filler should preferably not exceed 0.02% by weight (which can be measured in accordance with ISO 787-2: 1981) of the total composition. Suitable anhydrous filler may be utilised if required.

Should the need arise the composition may incorporate anhydrous fillers to scatter the light in various directions (e.g., titanium dioxide), then various fillers could be considered, for example thermally and/or electrically conductive fillers e.g., metallic fillers, anhydrous inorganic fillers and anhydrous meltable fillers, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from the group consisting of aluminium, copper, gold, nickel, tin, silver, and combinations thereof, and alternatively aluminium. Suitable metallic fillers are further exemplified by particles of the metals listed above having layers on their surfaces selected from the group consisting of aluminium nitride, aluminium oxide, copper oxide, nickel oxide, silver oxide, and combinations thereof. For example, the metallic filler may comprise aluminium particles having aluminium oxide layers on their surfaces.

Inorganic fillers which are anhydrous may be exemplified by onyx; aluminium trihydrate, metal oxides such as aluminium oxide, beryllium oxide, magnesium oxide, and zinc oxide; nitrides such as aluminium nitride and boron nitride; carbides such as silicon carbide and tungsten carbide; and combinations thereof. Further fillers may include barium titanate, carbon fibres, diamond, graphite, magnesium hydroxide, and a combination thereof.

Meltable fillers may comprise Bi, Ga, In, Sn, or an alloy thereof. The meltable filler may optionally further comprise Ag, Au, Cd, Cu, Pb, Sb, Zn, or a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50° C. to 250° C., alternatively 150° C. to 225° C. The meltable filler may be a eutectic alloy, a non-eutectic alloy, or a pure metal. Meltable fillers are commercially available.

The shape of the thermally conductive filler particles is not specifically restricted, however, rounded or spherical particles may prevent viscosity increase to an undesirable level upon high loading of the thermally conductive filler in the composition. The average particle size of the thermally conductive filler will depend on various factors including the type of thermally conductive filler selected and the exact amount added to the curable composition, as well as the bondline thickness of the device in which the cured product of the composition will be used. In some particular instances, the thermally conductive filler may have an average particle size ranging from 0.1 micrometre to 80 micrometres, alternatively 0.1 micrometre to 50 micrometres, and alternatively 0.1 micrometre to 10 micrometres.

The thermally conductive filler may be a single thermally conductive filler or a combination of two or more thermally conductive fillers that differ in at least one property such as particle shape, average particle size, particle size distribution, and type of filler. In some embodiments, combinations of metallic and inorganic fillers, such as a combination of aluminium and aluminium oxide fillers; a combination of aluminium and zinc oxide fillers; or a combination of aluminium, aluminium oxide, and zinc oxide fillers may be used. In other embodiments, it may be desirable to combine a first conductive filler having a larger average particle size with a second conductive filler having a smaller average particle size in a proportion meeting the closest packing theory distribution curve. An example would be mixing two aluminium oxide preparations having different average particle sizes. In other embodiments, different thermally conductive filler materials with difference sizes may be used, for example, a combination of an aluminium oxide having a larger average particle size with a zinc oxide having a smaller average particle size. Alternatively, it may be desirable to use combinations of metallic fillers, such as a first aluminium having a larger average particle size and a second aluminium having a smaller average particle size. Use of a first filler having a larger average particle size and a second filler having a smaller average particle size than the first filler may improve packing efficiency, may reduce viscosity, and may enhance heat transfer. Typically when present filler will be cumulatively present in an amount of up to about 20% by weight of the composition.

Other optional additives includes anhydrous reinforcing and/or anhydrous extending fillers e.g., precipitated and ground silica, precipitated and ground calcium carbonate, treated silicas, glass beads, carbon black, graphite, carbon nanotubes, quartz, talc, titanium dioxide, chopped fibre such as chopped KEVLAR®, or a combination thereof, filler treating agents, stabilizers (e.g., a hydrosilylation cure stabilizer, a heat stabilizer, or a UV stabilizer), adhesion promoters, a surfactant, a flux agent, an acid acceptor, a hydrosilylation inhibitor and/or an anti-corrosion additives and a combination thereof. The filler can also be a siloxane resin comprising $R_3SiO_{1/2}$ units and $SiO_{4/2}$ units, where R is a hydroxyl or a hydrocarbon radical bound directly or via an oxygen atom to the silicon atom.

Filler Treating Agent

The thermally conductive filler and/or the anhydrous reinforcing and/or extending filler if present, may optionally be surface treated with a treating agent. Treating agents and treating methods are known in the art. The surface treatment of the filler(s) is typically performed, for example with a fatty acid or a fatty acid ester such as a stearate, or with organosilanes, organosiloxanes, or organosilazanes such as hexaalkyl disilazane or short chain siloxane diols. Generally the surface treatment renders the filler(s) hydrophobic and therefore easier to handle and obtain a homogeneous mixture with the other components in the composition. Silanes such as

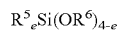

$$R^5_e Si(OR^6)_{4-e}$$

wherein $R^5$ is a substituted or unsubstituted monovalent hydrocarbon group of 6 to 20 carbon atoms, for example, alkyl groups such as hexyl, octyl, dodecyl, tetradecyl, hexadecyl, and octadecyl, and aralkyl groups such as benzyl and phenylethyl, with the alkyl groups of 6 to 20 carbon atoms being preferred. $R^6$ is an alkyl group of 1 to 6 carbon atoms, and letter e is equal to 1, 2 or 3 may also be utilised as the treating agent for fillers.

Adhesion Promoter

Suitable adhesion promoters may comprise alkoxysilanes of the formula $R^{14}{}_h Si(OR^{15})_{(4-h)}$, where subscript h is 1, 2, or 3, alternatively h is 3. Each $R^{14}$ is independently a monovalent organofunctional group. $R^{14}$ can be an epoxy functional group such as glycidoxypropyl or (epoxycyclohexyl)ethyl, an amino functional group such as aminoethylaminopropyl or aminopropyl, a methacryloxypropyl, a mercapto functional group such as mercaptopropyl or an unsaturated organic group. Each $R^{15}$ is independently an unsubstituted, saturated hydrocarbon group of at least 1 carbon atom. $R^{15}$ may have 1 to 4 carbon atoms, alternatively 1 to 2 carbon atoms. $R^{15}$ is exemplified by methyl, ethyl, n-propyl, and iso-propyl. When present adhesion promoters will be present in an amount of from 0.01% to 2 wt. %, alternatively 0.05 to 2 wt. %, alternatively 0.1 to 1 wt. % of adhesion promoter based on the weight of the total composition when mixed. Typically the adhesion promoter is present in cure package (part B) of the two part composition. When present the hydrolysable (alkoxy groups of the adhesion promoter will be included in the calculations when determining the ratios hereinbefore described.

Examples of suitable adhesion promoters include glycidoxypropyltrimethoxysilane and a combination of glycidoxypropyltrimethoxysilane with an aluminium chelate or zirconium chelate. Examples of adhesion promoters may be found in U.S. Pat. Nos. 4,087,585 and 5,194,649. Preferably, the speed of hydrolysis of the adhesion promoter should be lower than the speed of hydrolysis of the cross-linker in order to favour diffusion of the molecule towards the substrate rather than its incorporation in the product network.

Suitable surfactants include silicone polyethers, ethylene oxide polymers, propylene oxide polymers, copolymers of ethylene oxide and propylene oxide, other non-ionic surfactants, and combinations thereof. The composition may comprise up to 0.05% of the surfactant based on the weight of the composition.

Flux Agent

The composition may comprise up to 2% of a flux agent based on the weight of the composition. Molecules containing chemically active functional groups such as carboxylic acid and amines can be used as flux agents. Such flux agents can include aliphatic acids such as succinic acid, abietic acid, oleic acid, and adipic acid; aromatic acids such as benzoic acids; aliphatic amines and their derivatives, such as triethanolamine, hydrochloride salts of amines, and hydrobromide salts of amines. Flux agents are known in the art and are commercially available.

Acid Acceptor

Suitable acid acceptors include magnesium oxide, calcium oxide, and combinations thereof. The composition may comprise up to 2% of Acid Acceptor based on the weight of the composition, if appropriate.

Anti Corrosion Additives,

Nitrogen/sulphur containing heterocyclic compounds containing a triazole structure, a thiadiazole structure, a benzotriazole structure, a mercaptothiozole structure, a mercaptobenzothiazole structure or a benzimidazole structure.

In one embodiment of the invention the composition used to cure the material composition is a mixture of a condensation curable polymer, cross-linker and catalyst as described above in combination with a hydrosilylation curable polymer together with a suitable cross-linker and catalyst. Any suitable polymer curable via a hydrosilylation reaction pathway may be utilized. Typically the polymer is a polydialkyl siloxane or polyalkylphenyl siloxane having terminal groups containing one or more unsaturated groups (e.g., alkenyl terminated e.g., ethenyl terminated, propenyl terminated, allyl terminated ($CH_2=CHCH_2-$)) or terminated with acrylic or alkylacrylic such as $CH_2=C(CH_3)-CH_2-$ groups Representative, non-limiting examples of the alkenyl groups are shown by the following structures; $H_2C=CH-$, $H_2C=CHCH_2-$, $H_2C=C(CH_3)CH_2-$, $H_2C=CHCH_2CH_2-$, $H_2C=CHCH_2CH_2CH_2-$, and $H_2C=CHCH_2CH_2CH_2CH_2-$. Representative, non-limiting examples of alkynyl groups are shown by the following structures; $HC\equiv C-$, $HC\equiv CCH_2-$, $HC\equiv CC(CH_3)_2-$, $HC\equiv CC(CH_3)_2CH_2-$ Alternatively, the unsaturated organic group can be an organofunctional hydrocarbon such as an acrylate, methacrylate and the like such as alkenyl and/or alkynyl groups. Alkenyl groups are particularly preferred. The hydrosilylation curable polymer may therefore be further defined as an alkenyldialkylsilyl end-blocked polydialkylsiloxane which may itself be further defined as vinyldimethylsilyl end-blocked polydimethylsiloxane. Alternatively The polymer may be further defined as a dimethylpolysiloxane capped at one or both molecular terminals with dimethylvinylsiloxy groups; a dimethylpolysiloxane capped at one or both molecular terminals with methylphenylvinylsiloxy groups; a copolymer of a methylphenylsiloxane and a dimethylsiloxane capped at both one or both molecular terminals with dimethylvinylsiloxy groups; a copolymer of diphenylsiloxane and dimethylsiloxane capped at one or both molecular terminals with dimethylvinylsiloxy groups, a copolymer of a methylvinylsiloxane and a dimethylsiloxane capped at one or both molecular terminals with dimethylvinylsiloxy groups; a copolymer of a methylvinylsiloxane and a dimethylsiloxane capped at one or both molecular terminals with dimethylvinylsiloxy groups; a methyl (3,3,3-trifluoropropyl) polysiloxane capped at one or both molecular terminals with dimethylvinylsiloxy groups; a copolymer of a methyl (3,3,3-trifluoropropyl) siloxane and a dimethylsiloxane capped at one or both molecular terminals with dimethylvinylsiloxy groups; a copolymer of a methylvinylsiloxane and a dimethylsiloxane capped at one or both molecular terminals with silanol groups; a copolymer of a methylvinylsiloxane, a methylphenylsiloxane, and a dimethylsiloxane capped at one or both molecular terminals with silanol groups; or an organosiloxane copolymer composed of siloxane units represented by the following formulae: $(CH_3)_3SiO_{1/2}$, $(CH_3)_2(CH_2=CH)SiO_{1/2}$, $CH_3SiO_{3/2}$, $(CH_3)_2SiO_{2/2}$, $CH_3PhSiO_{2/2}$ and $Ph_2SiO_{2/2}$.

There is also provided herein a method of making the material as hereinbefore described whereby the aforementioned two parts of the composition are intermixed and cured. Subsequent to intermixing in one embodiment the condensation curable material composition may be applied on to a substrate using a suitable dispenser such as for example curtain coaters, spray devices die coaters, dip coaters, extrusion coaters, knife coaters and screen coaters which upon cure material provides a coating on said substrate.

Materials and encapsulants in accordance with the above may be utilised in a wide variety of applications, including, for the sake of example as an encapsulant/pottant in an electronic article. The article may be a power electronic article e.g., an electronic component with material composition disposed thereon such that the cured material encapsulates, either partially or completely, the electronic component. Alternatively the electronic article may be an integrated circuit (IC), or light emitting diodes (LED) system or may be a printed circuit board (PCB).

The silicone material as hereinbefore described is designed for use in optical applications and electronics applications, including both microelectronics and macro-electronics applications as well as optoelectronics applications and thermally conductive electronics applications, such as making thermally conductive adhesives. Furthermore, the silicone material of the present invention may be transparent and therefore may be potentially suitable for use as an encapsulant for light guides e.g., those used to make an optoelectronic device comprising the light guide and at least one light element. The optoelectronic device may comprise at least one light element and a free-standing light guide e.g., a composite light guide configured to transmit light when light is emitted from one or more light elements. Material herein may function as an optical encapsulant for encapsulating the at least one light element. The light guide might also include a lens for controlling direction of light being emitted from the at least one light element, at least one electrical connector for conducting electricity to the at least one light element, or any combination of two or more or all of the preceding additional elements. The electrical connector(s) independently may be a wire, tabbing, or ribbon and may be made of a highly conductive metal such as Cu, Au, Ag, and alloys thereof. Such optoelectronic devices may be used to make luminaires (devices having at least one light element that is a light-generating element). The luminaire may comprise an optoelectronic device of any one of the preceding embodiments and a power supply for powering the at least one light element. The luminaire may further comprise a lens for controlling direction of light being emitted from the at least one light element, at least one electrical connector for conducting electricity to the at least one light element. The power supply may be in operative electrical communication with the at least one light element via electrical connector(s). Each of the above light emitting devices may be a light-emitting diode (LED), a liquid crystal display (LCD), or any other light source. In the absence of filler the composition as described herein is transparent and/or optically clear and as such is particularly suitable for protecting LED and/or LCD lighting from the environment. Such a material when used as an encapsulant has several significant advantages over commercial products, namely it has a satisfactorily high light transmission, it ages without any substantial discolouration (i.e., yellowing); the composition prior to cure, even after the separate parts have been mixed is at a relatively low viscosity; it is designed to have rapid room temperature cure, i.e., subsequently to mixing it cures in the bulk of the composition not from the air-sealant interface as is the case for most titanate type catalyst; and importantly in has proven adhesion to an assortment of electric substrates with and without. Furthermore, given the cross-linker used the 2 part composition may be mixed in a 1 to 1 ratio as discussed above. It is not sensitive to inhibition or reversion as is the case for Pt and tin based catalysts respectively.

Cured silicone materials prepared from a material composition as hereinbefore described may adhere to various substrates such as electrical or electronic components and/or parts, not least metal substrates such as gold, silver, aluminum, copper, and electroless nickel; as well as polymeric substrates such as FR4 (a flame resistant composite material composed of woven fibre glass cloth with an epoxy resin binder), Nylon, polycarbonate, Lucite (which is polymethylmethacrylate, PMMA), polybutylene terephthalate (PBT), and liquid crystal polymers such as Xydar®, available from Solvay Chemicals, Houston, Tex. 77098 USA.

The electrical or electronic components and/or parts may be filled with the silicone material by any appropriate method by, for example, contacting the portion of the electrical or electronic part to be protected with the silicone material, and then curing this composition by through condensation cure i.e., by letting it stand at room temperature.

Any suitable electrical or electronic part may be sealed with the silicone material as described above but because the silicone material of the present invention can suppress the occurrence of air bubbles and cracks and exhibits good bonding to electrical or electronic parts even under high-temperature conditions, it can be advantageously used in power devices used under high-temperature conditions, particularly power devices such as a motor control, a motor control for transport, a power generation system, or a space transportation system.

Furthermore, because the silicone material of the present invention has a certain degree of cold resistance in addition to the heat resistance demanded in a Si—C semiconductor chip (for example, heat resistance of 180° C. or above). The electronic article can be a power module, e.g., one of more of the aforementioned devices for power converters, inverters, boosters, traction controls, industrial motor controls, power distribution and transportation systems, especially in power devices that demand the ability to withstand sharp temperature differences, and can improve the durability and reliability of such power devices.

Examples of such power devices that demand heat resistance and cold resistance include motor controls used in cold regions such as general-purpose inverter controls, servo motor controls, machine tools or elevators, electric vehicles, hybrid cars or motor controls for rail transport used in cold regions, power generating systems used in cold regions such as solar, wind or fuel cell power generators, space transportation systems used in space, and the like. Note that "cold regions" indicates regions where the temperature falls below 0° C.

Furthermore, the silicone material is also effective in sealing electrical or electronic parts having a structure in which the space between electrodes, between electrical elements or between an electrical element and the package in the electrical or electronic part is narrow, or having a structure in which these structures cannot track to the expansion and contraction of the silicone material. For example, it may be used in electrical circuits or modules on which electrical elements such as semiconductor elements, capacitors and resistors are mounted, i.e., various sensors such as pressure sensors that are generally sealed or filled with silicone material, and automotive igniters, regulators and the like.

The electronic component may be defined as a chip, such as a silicon chip or a silicon carbide chip, one or more wires, one or more sensors, one or more electrodes, integrated circuits (ICs), e.g., hybrid ICs, power devices, insulated gate bipolar transistor (IGBT), a rectifier such as a Schottky diode, a PiN diode, a merged PiN/Schottky (MPS) rectifier and Junction barrier diode, a bipolar junction transistors (BJTs), a thyristor, a metal oxide field effect transistor (MOSFET), a high electron mobility transistor (HEMT), a static induction transistors (SIT), a power transistor, and the like.

The electronic article may include the electronic component and a first layer. The first layer is not particularly limited and may be a semiconductor, a dielectric, metal, plastic, carbon fibre mesh, metal foil, a perforated metal foil (mesh), a filled or unfilled plastic film (such as a polyamide sheet, a polyimide sheet, polyethylene naphthalate sheet, a polyethylene terephthalate polyester sheet, a polysulphone sheet, a polyether imide sheet, or a polyphenylene sulphide sheet), or a woven or nonwoven substrate (such as fibreglass cloth, fibreglass mesh, or aramid paper). Alternatively, the first layer may be further defined as a semiconductor and/or dielectric film.

The silicone material may be sandwiched between the electronic component and the first layer, and/or may be disposed on and in direct contact with the first layer, and/or on and in direct contact with the electronic component. If the silicone material is disposed on and in direct contact with the first layer, the silicone material may still be disposed on the electronic component but may include one or more layers or structures between the silicone material and the electronic component.

Equally the composition may also contain light scattering particles such as $TiO_2$ and silica which is seen to be of significant benefit for LED light encapsulation.

Examples

All viscosity measurements were made using a Brookfield cone plate viscometer RV DIII with the most appropriate cone plate at 23° C. unless otherwise indicated.

Polydimethylsiloxanes having terminal groups containing Si—OH (viscosity ca 2,000 mPa·s) exhibit a typical number average molecular weight (Mn) of 22,000 g/mol determined by Gel permeation chromatography (GPC). Cross-linker, trimethoxysilyl terminated polydimethylsiloxane (viscosity ca 2,000 mPa·s) exhibits a typical number average molecular weight (Mn) of 22,000 g/mol determined by GPC.

Part B was prepared by mixing stepwise ingredients of the table directly after their addition in a speedmixer for 30 seconds at 2300 rpm.

The compositions used in the following examples were made by mixing part A and part B together in a speedmixer. The part A and Part B were introduced into a speedmixer and were then mixed for four periods of 30 seconds at a speed of 2300 revolutions per minute (rpm). The resulting mixture was poured into an aluminium cup and onto a glass substrate surface and left to cure for 7 days at room temperature.

TABLE 1a

|  | Example 1 | Example 2 | Example 3 | Example 4 | Example 5 |
|---|---|---|---|---|---|
| Part A |  |  |  |  |  |
| OH terminated polydimethylsiloxane (viscosity ca 2,000 mPa · s) | 100 | 100 | 100 | 100 | 100 |
| Part B |  |  |  |  |  |
| Trimethoxysilyl terminated polydimethylsiloxane (viscosity ca 2,000 mPa · s) | 100 | 100 | 100 | 100 | 100 |
| Aminopropyl triethoxysilane |  | 0.2 | 0.2 | 0.2 | 0.4 |
| tetra n-butyl titanate | 0.2 | 0.2 | 0.3 | 0.3 | 0.4 |
| Transparent upon visual inspection | Yes | Yes | Yes | Yes | Yes |
| Mixing ratio weight | 1 | 1 | 1 | 0.7 | 1 |
| SiOH/SiOR mol ratio | 0.36 | 0.33 | 0.33 | 0.23 | 0.29 |
| SiOH/Ti mole ratio | 15.5 | 15.5 | 10.3 | 7.3 | 7.8 |

TABLE 1b

|  | Comparatives | | |
|---|---|---|---|
|  | Comparative example 1 | Comparative Example 2 | Comparative Example 3 |
| Part A |  |  |  |
| OH terminated polydimethylsiloxane (viscosity ca 2,000 mPa · s) | 100 | 100 | 100 |
| Part B |  |  |  |
| Trimethoxysilyl terminated polydimethylsiloxane (viscosity ca 2,000 mPa · s) | 100 | 100 | 100 |
| Aminopropyl triethoxysilane |  | 0.2 | 0.2 |
| tetra n-butyl titanate | 0.4 | 0.3 | 0.4 |
| Mixing ratio weight | 1 | 0.5 | 1 |
| SiOH/SiOR mol ratio | 0.36 | 0.16 | 0.33 |
| SiOH/Ti mole ratio | 7.8 | 5 | 7.8 |

It will be appreciated that none of these compositions contained filler and as such the moisture value for said compositions upon mixing is zero. Upon visual inspection each sample was considered transparent both before and after cure. Adhesive failure (AF) refers to the situation when the coating detaches cleanly (peels off) from the substrate. Cohesive failure (CF) is observed when the coating itself breaks without detaching form the substrate plate.

TABLE 2a

|  | Example 1 | Example 2 | Example 3 | Example 4 | Example 5 |
|---|---|---|---|---|---|
| Bubbles in aluminium cup | no | no | no | no | no |
| Adhesion to glass after 7 day cure at room temperature | CF | CF | CF | CF | CF |
| Adhesion to anodized aluminum after 7 days cure at room temperature | CF | CF | CF | CF | CF |
| Adhesion to epoxy printed circuit board after 7 days cure at room temperature | AF | CF | CF | CF | CF |

As previously discussed, addition cure materials do not develop sufficient adhesion at room temperature to substrates. Each of examples 1 to 5 exhibit adhesion on glass and aluminium at room temperature. Moreover, good adhesion results were obtained when samples had been placed on printed circuit boards after 7 days of cure at room temperature in respect of examples 2 to 5. Example 1 did not contain any adhesion promoter, which, it is believed, consequently resulted in its adhesive failure on epoxy printed circuit boards after a 7 day cure at room temperature. This indicates that, in the absence of adhesion promoter, whilst the composition of Example 1 is perfectly adequate for adhering to many substrates it has a comparatively limited adhesion profile, compared to examples 2 to 5 which suggests that it may have limited potential use in the absence of an adhesion promoter.

TABLE 2b

|  | Comparative example 1 | Comparative example 2 | Comparative example 3 |
|---|---|---|---|
| Bubbles in aluminium cup | yes | yes | no |
| Adhesion to glass after 7 day cure at room temperature | CF | CF | CF |
| Adhesion to anodized aluminum after 7 days cure at room temperature | CF | CF | CF |
| Adhesion to epoxy printed circuit board after 7 days cure at room temperature | AF | CF | AF |

Unwanted bubbling was observed in comparative examples 1 and 2. Without being bound to any current theory, it was thought that this would appear be due to the low SiOH/Ti molar ratio. Whilst bubbles are not observed in comparative example 3, comparative example 3 does contain adhesion promoter and it was found that even with adhesion promoter present, comparative Example 3 failed to show any improvement over example 1 (no adhesion promoter) with respect to adhesion to epoxy circuit board as it too exhibited adhesion failure, despite containing said adhesion promoter. This is unlike examples 2, 3, 4 and 5.

The invention claimed is:

1. A room temperature curable encapsulation/potting material composition, the composition comprising:
   (i) at least one condensation curable silyl terminated polymer having at least one, optionally at least two, silicon bonded hydroxyl functional group(s) per molecule;
   (ii) at least one cross-linker selected from the group consisting of
       silanes having at least two hydrolysable groups, optionally at least three hydrolysable groups, per molecule; and
       silyl functional molecules having at least two silyl groups, each silyl group containing at least one hydrolysable group; and
   (iii) at least one condensation catalyst selected from the group consisting of titanates and zirconates; wherein the molar ratio of the sum of moisture present in the composition, as determined in accordance with ISO 787-2:1981, and total silicon bonded hydroxyl groups: the catalyst is >7:1; and
   (a) when the molar ratio of the sum of moisture present in the composition and total silicon bonded hydroxyl groups:the catalyst is from >7:1 to 10:1, the molar ratio of total silicon bonded hydroxyl groups:total hydrolysable groups is between 0.1:1 to 0.3:1; and
   (b) when the molar ratio of the sum of moisture present in the composition and total silicon bonded hydroxyl groups:the catalyst is >10:1, the molar ratio of total silicon bonded hydroxyl groups:total hydrolysable groups is between 0.1:1 to 0.5:1.

2. The composition in accordance with claim 1, wherein the molar ratio of total silicon bonded hydroxyl groups:total hydrolysable groups is between 0.1:1 to 0.5:1, and the molar ratio of the sum of moisture present in the composition and total silicon bonded hydroxyl groups:the catalyst is >10:1.

3. The composition in accordance with claim 1, in the form of a gel or an elastomer.

4. The composition in accordance with claim 1, wherein the composition is stored in two parts, the parts having: polymer (i) and cross-linker (ii) in a base part and polymer (i) and catalyst (iii) in a cure part; or having polymer (i) in a base part and cross-linker (ii) and catalyst (iii) in a cure part; or having a first polymer (i) and cross-linker (ii) in a base part and a second polymer (i) and catalyst (iii) in a cure part.

5. The composition in accordance with claim 4, wherein the two parts are mixed in a base part:cure part weight ratio of from 10:1 to 1:1.

6. The composition in accordance with claim 5, wherein polymer (i) and filler are in the base part and cross-linker (ii) and catalyst (iii) are in the cure part.

7. The composition in accordance with claim 6, wherein the filler comprises, or consists of, light scattering particles.

8. The composition in accordance with claim 1, wherein cross-linker (ii) is a silicone or organic polymer chain bearing alkoxy functional terminal groups.

9. The composition in accordance with claim 8, wherein cross-linker (ii) is a polydimethylsiloxane having at least one trialkoxy terminal group.

10. The composition in accordance with claim 1, further comprising at least one adhesion promoter in an amount of from 0.1 to 2 wt. % of the total composition.

11. A silicone encapsulation/potting material, wherein the material is the condensation reaction product of the composition in accordance with claim 1.

12. An encapsulation/potting material for electrical or electronic parts, comprising a composition and/or the condensation reaction product of the composition, wherein the composition is in accordance with claim 1.

13. The silicone encapsulation/potting material in accordance with claim 11, which is optically clear.

14. An electrical or electronic part encapsulated and/or potted with the silicone encapsulation/potting material of claim 11.

15. The electrical or electronic part in accordance with claim 14, wherein the electrical or electronic part comprises a metal substrate selected from the group consisting of gold, silver, aluminum, copper, electroless nickel, and combinations thereof; and/or a polymeric substrate selected from the group consisting of FR4, Nylon, polycarbonate, polymethylmethacrylate, polybutylene terephthalate, liquid crystal polymers, and combinations thereof.

16. The electrical or electronic part in accordance with claim 14, comprising a light emitting device comprising one or more a light-emitting diodes (LED), or liquid crystal displays (LCD).

17. The electrical or electronic part in accordance with claim 14, selected from the group consisting of chips, wires, sensors, electrodes, integrated circuits (ICs), power devices, insulated gate bipolar transistors (IGBTs), rectifiers, Schottky diodes, PiN diodes, merged PiN/Schottky (MPS) rectifiers, junction barrier diodes, bipolar junction transistors (B3JTs), thyristors, metal oxide field effect transistors (MOSFETs), high electron mobility transistors (HEMTs), static induction transistors (SITs), power transistors, and combinations thereof.

18. An encapsulant or pottant for electrical and/or electronic devices, solar photovoltaic modules, and/or light emitting diodes, wherein the encapsulant or pottant comprises a composition and/or the condensation reaction product of the composition, and wherein the composition is in accordance with claim 1.

* * * * *